United States Patent
Yergol et al.

(10) Patent No.: US 11,909,211 B2
(45) Date of Patent: Feb. 20, 2024

(54) PROCEDURE FOR OPERATING AN ELECTRICAL ENERGY STORAGE UNIT AND ALSO CORRESPONDING APPARATUS, COMPUTER PROGRAM, MACHINE-READABLE STORAGE MEDIUM AND ELECTRICAL ENERGY STORAGE UNIT

(71) Applicant: Robert Bosch GmbH, Stuttgart (DE)

(72) Inventors: Girish Yergol, Stuttgart (DE); Christel Sarfert, Korntal-Muenchingen (DE); Vincent Scharff, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 315 days.

(21) Appl. No.: 16/944,720

(22) Filed: Jul. 31, 2020

(65) Prior Publication Data
US 2021/0036517 A1  Feb. 4, 2021

(30) Foreign Application Priority Data

Aug. 2, 2019 (DE) ............... 10 2019 211 634.5

(51) Int. Cl.
*H02J 3/28* (2006.01)
*G06N 7/00* (2023.01)
*H02J 3/16* (2006.01)

(52) U.S. Cl.
CPC .............. *H02J 3/28* (2013.01); *G06N 7/00* (2013.01); *H02J 3/16* (2013.01)

(58) Field of Classification Search
CPC .. H02J 3/28; H02J 3/16; H02J 2310/46; H02J 7/00712; H02J 7/007194; H02J 7/007182; G06N 7/00; G01R 31/389; G01R 31/367; G01R 31/387; G01R 31/396; G01R 31/378
See application file for complete search history.

(56) References Cited

U.S. PATENT DOCUMENTS

| | | | |
|---|---|---|---|
| 2007/0285061 A1* | 12/2007 | Zettel | G01R 31/392 320/132 |
| 2010/0153038 A1 | 6/2010 | Tomura et al. | |
| 2011/0307202 A1* | 12/2011 | Benjamin | G01R 19/16542 702/63 |

(Continued)

FOREIGN PATENT DOCUMENTS

| | | |
|---|---|---|
| CN | 102520361 | 6/2012 |
| DE | 102015108295 | 12/2015 |
| JP | 2009240080 A * | 10/2009 |

*Primary Examiner* — Mohammad Ali
*Assistant Examiner* — Dhruvkumar Patel
(74) *Attorney, Agent, or Firm* — Michael Best & Friedrich LLP

(57) ABSTRACT

An apparatus, computer program, storage medium and electrical energy storage system for operating an electrical energy storage unit. The procedure includes ascertaining at least one predefined first condition being checked which represents a use of the electrical energy storage unit and/or an accuracy of a mathematical model of the electrical energy storage unit. If the predefined first condition is satisfied, at least one value of a parameter of the mathematical model is ascertained and subsequently this parameter value is changed in the mathematical model. The electrical energy storage unit is subsequently operated with the changed mathematical model.

9 Claims, 3 Drawing Sheets

(56) References Cited

U.S. PATENT DOCUMENTS

| | | | | |
|---|---|---|---|---|
| 2012/0105013 | A1* | 5/2012 | Lin | H02J 7/0048 |
| | | | | 180/65.29 |
| 2015/0069978 | A1* | 3/2015 | Watanabe | H02J 3/16 |
| | | | | 323/205 |
| 2015/0355283 | A1 | 12/2015 | Lee | |
| 2016/0109527 | A1* | 4/2016 | Drenkelforth | B60L 58/12 |
| | | | | 702/63 |
| 2016/0308360 | A1* | 10/2016 | Oates | H02M 5/458 |
| 2017/0328957 | A1* | 11/2017 | Suzuki | H01M 10/48 |
| 2018/0045787 | A1* | 2/2018 | Hellgren | B60L 3/0046 |
| 2018/0143257 | A1 | 5/2018 | Garcia et al. | |
| 2018/0238969 | A1* | 8/2018 | Li | H01M 10/486 |

* cited by examiner

PROCEDURE FOR OPERATING AN ELECTRICAL ENERGY STORAGE UNIT AND ALSO CORRESPONDING APPARATUS, COMPUTER PROGRAM, MACHINE-READABLE STORAGE MEDIUM AND ELECTRICAL ENERGY STORAGE UNIT

BACKGROUND OF THE INVENTION

The present disclosure proceeds from a procedure for operating an electrical energy storage unit and also a corresponding apparatus, a corresponding computer program, a corresponding machine-readable storage medium and a corresponding unit.

As a result of the increasing electrification, especially of motor vehicles, electrical energy storage units are taking on a significance which is becoming ever greater. There are various degrees of electrification here. There are for example purely electrically driven vehicles and also vehicles with an internal combustion engine where an electrical motor takes over the propulsion of the vehicle only from time to time or assists the internal combustion engine. These various manifestations of electrification typically have various levels of voltage and various configurations of the electrical energy storage units employed.

A common feature of all these forms of implementation is that the electrical energy storage units employed in them are exposed to aging effects, which shows up for example as a change in the internal resistance of the electrical energy storage units. Thus, internal resistance values for an electrical energy storage unit that are recorded at a predefined point in time and characterize the electrical energy storage unit directly after its fabrication for example or before it is actually used as an energy storage device are no longer up to date after a certain time. Furthermore, depending on production, there are differences between electrical energy storage units which show up as differing resistance values of the electrical energy storage units. While these differences are mostly not particularly pronounced, they can still influence the performance capability of an applicable electrical energy storage system in which they are employed. This can firstly lead to problems when predicting the electric power available from the electrical energy storage unit, if, that is, the available power is over-estimated, and can also prevent an electrical energy storage unit from being replaced in good time if, contrary to the reality in the system, the electrical energy storage unit is still recorded as capable of functioning or of adequate performance.

The document US 2018/0143257 describes a procedure for determining parameter values of a battery model which depicts a battery mathematically.

The document CN 102520361 describes a procedure for determining a coefficient of aging, where the internal resistance of a battery is ascertained.

SUMMARY OF THE INVENTION

A procedure is disclosed.

The procedure for operating an electrical energy storage unit involves at least one predefined first condition being checked which represents a use of the electrical energy storage unit and/or an accuracy of a mathematical model of the electrical energy storage unit. In particular, a use of the electrical energy storage unit can be modeled by the state of charge, its age or its temperature, for example. The accuracy of a mathematical model of the electrical energy storage unit can be ascertained for example by means of comparison with corresponding measured values, for example voltage measured values. The mathematical model can for example be saved in a data store. The mathematical model can for example comprise differential equations or difference equations or algebraic equations. Furthermore, a data based family of characteristic curves can also be a constituent part of the mathematical model.

If the predefined first condition is satisfied, at least one value of a parameter of the mathematical model is ascertained and subsequently this parameter value is changed in the mathematical model. Thus, the mathematical model is adapted to changed properties of the electrical energy storage unit which can arise for example through aging effects.

The electrical energy storage unit is subsequently operated with the changed mathematical model. This comprises for example a determination of the state of charge and a prediction of the electric power available, which typically take place by means of the mathematical model on an electronic control unit.

It is thus advantageously ensured that a change in the mathematical model occurs only if the at least one condition is satisfied, whereby the accuracy for the ascertainment of the parameter value is increased and in addition robustness is achieved, that is to say insensitivity in the presence of model errors in the mathematical model and also insensitivity in the presence of external influences, for example temperature influences. This enhances the quality of the parameter values ascertained and allows better and safer operation of the electrical energy storage system. Furthermore, the life of the electrical energy storage unit can be increased.

Advantageously, an electrical current magnitude is ascertained, where the current magnitude represents an electrical current which flows into or out of the electrical energy storage unit. Furthermore, a first voltage magnitude is ascertained which represents an electrical voltage which is present between two pole terminals of the electrical energy storage unit. Both can be achieved by the use of appropriate sensors.

Furthermore, a second voltage magnitude is ascertained which represents an electrical voltage and is obtained from the mathematical model of the electrical energy storage unit. At the same time, the mathematical model is loaded with the current magnitude ascertained, so as to supply the second voltage magnitude as output magnitude. The mathematical model comprises a resistance parameter which represents a resistance of the electrical energy storage unit and has an assigned predefined value. The value of the resistance parameter can display a temperature dependency, in particular can depend on the temperature of the electrical energy storage unit. This is advantageous since it allows the accuracy of the mathematical model to be ascertained in a simple manner, for example.

Advantageously, the first voltage magnitude and/or the second voltage magnitude is filtered. This is advantageous since the influence of unwanted frequencies, which arise from high frequency noise for example, is thus reduced, which markedly improves the quality of the resistance parameter value ascertained. The employment of a bandpass filter is conceivable, for example, by means of which particular frequency ranges are selectively filtered out and only relevant frequency components in the voltage magnitudes remain, for example in order to filter out a DC voltage component.

Advantageously, a state of charge of the electrical energy storage unit is ascertained, where the state of charge represents the use of the electrical energy storage unit. This is advantageous since the at least one parameter in a predefined range of the state of charge, which can be checked by the predefined first condition, can exhibit a low dependency on the state of charge and to that extent can be determined more accurately in this range, as it is insensitive to changes in the state of charge.

Advantageously, a temperature of the electrical energy storage unit is ascertained, where the temperature represents the use of the electrical energy storage unit. This is advantageous since the at least one parameter in a predefined range of the temperature, which can be checked by the predefined first condition, can have a low dependency on the temperature and to that extent can be determined accurately in this range, as it is insensitive to changes in the temperature.

Advantageously, an age of the electrical energy storage unit is ascertained, where the age represents the use of the electrical energy storage unit. The age can for example be ascertained from the amount of time elapsed since the fabrication of the electrical energy storage unit or from the amount of time elapsed since the installation of the electrical energy storage unit in a larger electrical energy storage system. This is advantageous since it can be used to determine whether the electrical energy storage unit is still at the beginning of its life cycle. Since mostly average values of the parameters of the mathematical model are used for the operation of the electrical energy storage unit, which values can easily deviate from the actual values of the electrical energy storage unit in question, however, it is advantageous to implement an appropriate correction at the beginning of the life cycle of the latter. Thus, aging effects which influence the parameter values can be reliably ignored in an advantageous way. This enhances the model accuracy of the mathematical model and thus contributes to safer operation of the electrical energy storage unit with an increased life.

Advantageously, the accuracy of the mathematical model is ascertained, where the accuracy can be ascertained for example by a calibration of model values with measured values, for example with voltage values. This is advantageous as it is thereby ensured that the mathematical model reflects the real response of the electrical energy storage unit with good accuracy. Alternatively, or additionally, it is possible to check whether the model error in the mathematical model, that is to say the quantitative deviation of the model values from measured values, has arrived at a state of convergence. Arrival at the state of convergence can be checked for example on the basis of whether a predefined quantitative deviation of the model values from measured values was not exceeded for a predefined period of time before the present point in time, for example 1 minute.

Advantageously, the predefined first condition for the representation of the use by the state of charge comprises a state of charge value in the range from 30% to 80%, especially from 40% to 70%. Depending on the kind of electrical energy storage unit, the dependency of the parameters or of the parameter of the mathematical model on the state of charge is low in this state of charge range, which facilitates and improves a more accurate determination of parameter values.

Advantageously, the predefined first condition for the representation of the use by the temperature of the electrical energy storage unit comprises a temperature value over 20° C., especially over 30° C. Depending on the kind of electrical energy storage unit, the dependency of the parameters or of the parameter of the mathematical model on the temperature is low in this temperature range, which facilitates and improves a more accurate determination of parameter values.

Advantageously, the predefined first condition for the representation of the use by the age of the electrical energy storage unit comprises an age value of fewer than 180 days, especially fewer than 90 days. This is advantageous since aging effects of the battery can be ignored, which facilitates and improves a more accurate determination of parameter values.

Advantageously, the predefined first condition for the representation of the accuracy of the mathematical model of the electrical energy storage unit comprises a quantitative deviation of the mathematical model from a measured value of less than 20 mV, especially less than 10 mV. Furthermore, the first condition can comprise a check as to whether the model error in the mathematical model has arrived at a state of convergence, that is to say has converged to a firm value. This is advantageous for evaluating the accuracy of the mathematical model, which facilitates and improves a more accurate determination of parameter values.

Advantageously, current measurement data of the electrical energy storage unit are captured by means of a current sensor in order to ascertain the current magnitude and/or voltage measurement data of the electrical energy storage unit are captured by means of a voltage sensor in order to ascertain the first voltage magnitude. This is advantageous as the aforementioned filter operations can be integrated in the corresponding sensors and implementation of the procedure is thus less expensive.

Furthermore, a subject of the disclosure is an apparatus for operating an electrical energy storage unit, comprising at least one means which is set up to carry out all the steps of the disclosed procedure. The at least one means can for example comprise a battery management control device and an appropriate power electronics system, for example an inverter, and also current sensors and/or voltage sensors and/or temperature sensors. An electronic control unit, especially in the form of a battery management control device, can also be such a means. An electronic control unit can be understood to mean especially an electronic control device which comprises for example a microcontroller and/or an application-specific hardware component, for example an ASIC, but equally a computer or a programmable logic controller can fall under that heading. Thus, the advantages stated above can be realized.

Furthermore, a subject of the disclosure is a computer program which comprises commands which have the effect that the disclosed apparatus carries out all the steps of the disclosed procedure. Thus, the advantages stated above can be realized.

Furthermore, a subject of the disclosure is a machine-readable storage medium on which the disclosed computer program is stored. Thereby, the advantages stated above can be realized.

Furthermore, a subject of the disclosure is an electrical energy storage system comprising at least one electrical energy storage unit and the disclosed apparatus. Thus, the advantages stated above can be realized An electrical energy storage unit can be understood to mean especially an electrochemical battery cell and/or a battery module with at least one electrochemical battery cell and/or a battery pack with at least one battery module. For example, the electrical energy storage unit can be a lithium based battery cell or a lithium based battery module or a lithium based battery pack. In particular, the electrical energy storage unit can be a lithium ion battery cell or a lithium ion battery module or a lithium ion battery pack. Furthermore, the battery cell can be of the lithium polymer accumulator, nickel metal hydride accumulator, lead acid accumulator, lithium air accumulator or lithium sulfur accumulator type or quite generally an accumulator of any electrochemical composition. A capacitor is also possible as an electrical energy storage unit.

BRIEF DESCRIPTION OF THE DRAWINGS

Advantageous embodiments of the invention are represented in the figures and presented in greater detail in the description that follows.

DETAILED DESCRIPTION

The same reference signs refer in all figures to the same apparatus components or the same procedure steps.

Figure 1:
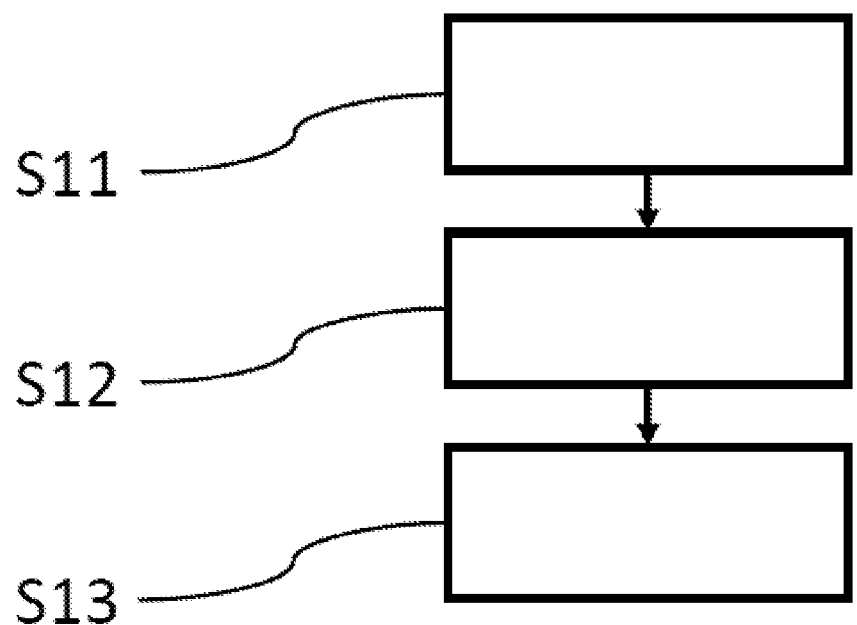
FIG. 1 a flow diagram of the disclosed procedure according to a first embodiment.

FIG. 1 shows a flow diagram of the disclosed procedure for operating an electrical energy storage unit according to a first embodiment.

Here, in a first step S11, at least one predefined first condition, which represents a use of the electrical energy storage unit and/or an accuracy of a mathematical model of the electrical energy storage unit, is checked. The at least one condition can comprise for example a state of charge value being in the range from 30% to 80% state of charge and/or a temperature of the electrical energy storage unit being at least 20° C., especially at least 30° C., and/or a quantitative accuracy of the mathematical model of the electrical energy storage unit in comparison with corresponding measured values for the electrical voltage being 10 mV at most. It is particularly preferred that all the exemplary conditions stated are satisfied.

On the assumption that the at least one first condition is satisfied, in a second step S12 at least one value for a parameter of the mathematical model is ascertained and the ascertained at least one parameter value is employed within the mathematical model, that is to say the mathematical model or the parametrization thereof with numerical values is changed accordingly.

In a third step S13 the electrical energy storage unit is operated with the changed mathematical model. This means for example that in an electronic control unit in which the disclosed procedure runs in computer-implemented form, that is to say as a computer program, the system operates with the changed parameter value. Control commands sent out from the electronic control unit may thus be based on the changed parameter value. This is relevant for example for a power prediction for the electrical energy storage unit in order to correctly model the present performance potential of the electrical energy storage unit.

Figure 2:
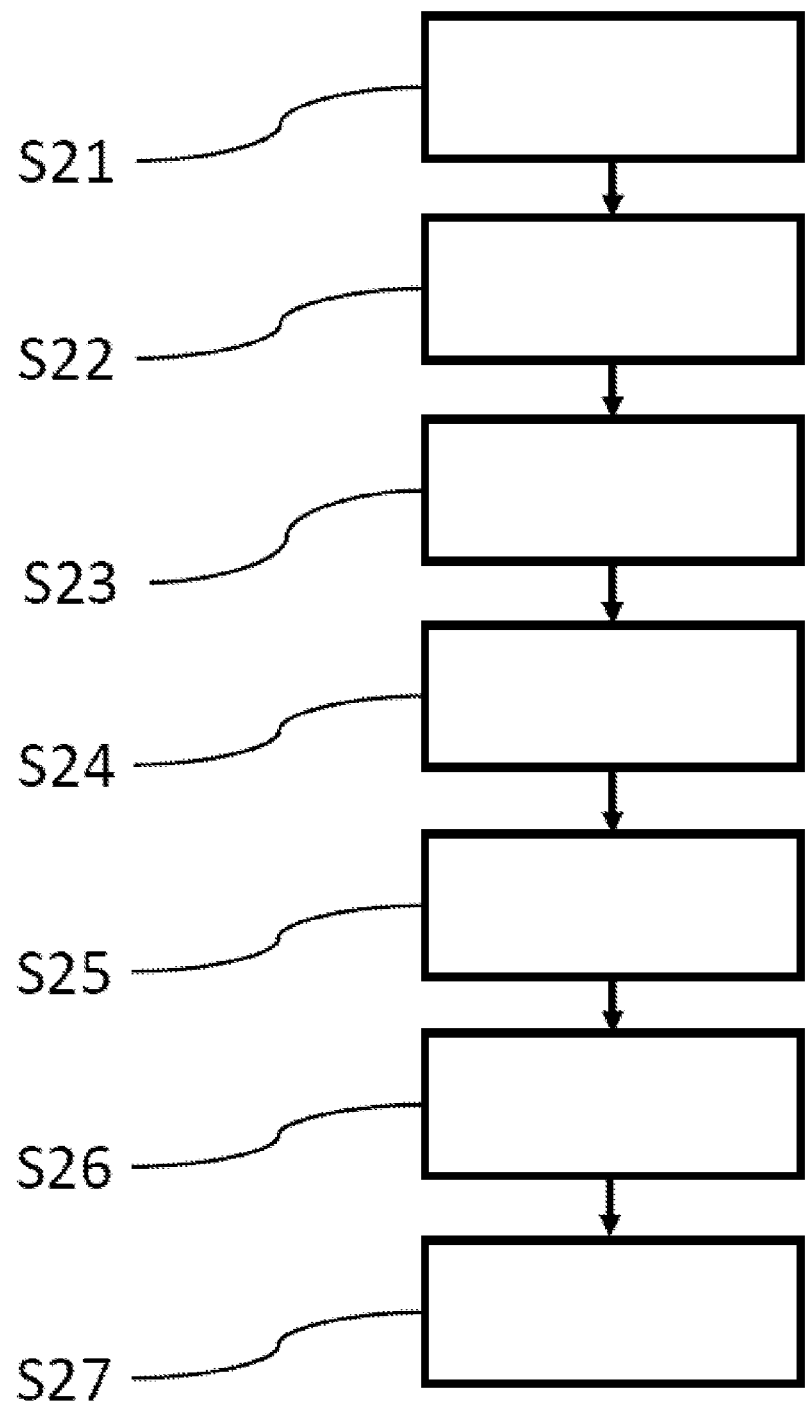
FIG. 2 a flow diagram of the disclosed procedure according to a second embodiment.

FIG. 2 shows a flow diagram of the disclosed procedure for operating an electrical energy storage unit according to a second embodiment.

In a first step S21 a current magnitude is ascertained, where the current magnitude represents an electrical current which flows into or out of the electrical energy storage unit. This can be achieved for example by means of measurement with a current sensor.

In a second step S22 a first voltage magnitude is ascertained which represents an electrical voltage which is present between two pole terminals of the electrical energy storage unit. This can be achieved for example by means of measurement with a voltage sensor.

In a third step S23 a second voltage magnitude is ascertained which represents an electrical voltage and is obtained from the mathematical model of the electrical energy storage unit, where, to this end, the mathematical model is loaded with the ascertained current magnitude. This means for example that appropriate values of the current magnitude are used as input values for the mathematical model, from which corresponding voltage values are obtained as an output magnitude of the mathematical model. Here, the mathematical model comprises a resistance parameter which represents a resistance of the electrical energy storage unit and has an assigned predefined value. This predefined value may, for example, have been ascertained in advance from laboratory measurements.

In a fourth step S24 the accuracy of the mathematical model is subsequently ascertained by means of comparison of the first voltage magnitude with the second voltage magnitude. Alternatively or additionally, a state of charge of the electrical energy storage unit and/or a temperature of the electrical energy storage unit and/or an age of an electrical energy storage unit can also be ascertained. The accuracy thus ascertained is used in a fifth step S25 to check whether the mathematical model achieves a predefined accuracy. Alternatively or additionally, a use of the electrical energy storage unit can be checked by means of the magnitudes cited above.

On the assumption that the check was successful, i.e. that a predefined accuracy is achieved, in a sixth step S26 at least one value of a parameter of the mathematical model, especially a value of a resistance parameter, is ascertained and the model or the model parameter value within the model is changed. This value can be ascertained for example by means of an observer, a familiar structure from control technology or a Kalman filter. It is possible to use the method of least squares too in order to adapt the mathematical model in the best possible way to applicable values of the first voltage magnitude by changing the parameter value.

In a seventh step S27 the electrical energy storage unit is operated with the changed mathematical model. This means, for example, that in an electronic control unit in which the disclosed procedure runs in computer-implemented form, that is to say as a computer program, the system is operated with the changed parameter value. Control commands sent out from the electronic control unit may thus be based on the changed parameter value. This is relevant for example for a power prediction for the electrical energy storage unit in order to correctly model the present performance potential of the electrical energy storage unit.

Figure 3:
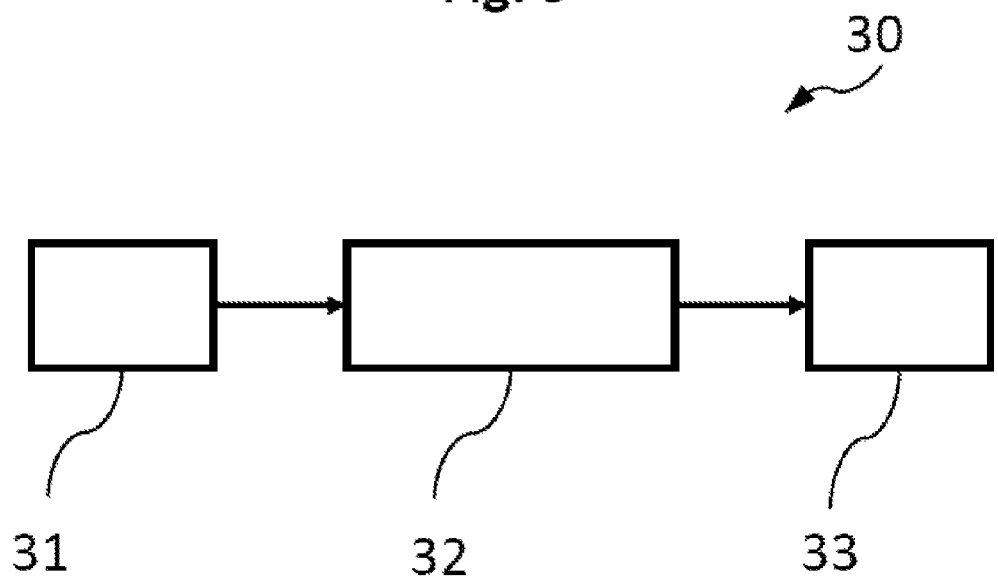
FIG. 3 a schematic depiction of the disclosed electrical energy storage system according to one embodiment.

FIG. 3 shows a schematic depiction of the disclosed electrical energy storage system 30 according to one embodiment. Here, the electrical energy storage system 30 comprises at least one electrical energy storage unit, not depicted here, sensors 31, an apparatus 32 and a power electronics component 33.

The apparatus 32 with the connected sensors 31, for example voltage and current sensors, can interchange data. It is also possible for data of the connected sensors 31 to be received only unidirectionally. Furthermore, the apparatus 32 can control the connected power electronics component 33 so that for example current limits are observed. The power electronics component 33 can be an inverter, for example.

The apparatus 32 comprises an electronic control unit, for example, which is not depicted separately in FIG. 3. The apparatus 32 can comprise further electronic control units too.

The invention claimed is:

1. A method for operating an electrical energy storage unit, the method comprising:
ascertaining, via a current sensor, a current magnitude which represents an electrical current which flows into or out of the electrical energy storage unit
ascertaining, via a voltage sensor, a first voltage magnitude which represents an electrical voltage which is present between two pole terminals of the electrical energy storage unit
ascertaining a second voltage magnitude which represents an electrical voltage and is obtained from the mathematical model of the electrical energy storage unit, where the mathematical model is loaded with the current magnitude;
checking, via an electronic control unit, for a predefined first condition which represents an accuracy of a mathematical model of the electrical energy storage unit, the predefined first condition including a quantitative deviation of the second voltage magnitude from the first voltage magnitude of less than 20 mV;
ascertaining, via an electronic control unit, in response to the predefined first condition being met, a value of a parameter of the mathematical model and changing the value of the parameter in the mathematical model; and
operating, via an electronic control unit, the electrical energy storage unit with the changed mathematical model.

2. The method according to claim 1,
where the mathematical model comprises a resistance parameter which represents a resistance of the electrical energy storage unit and has an assigned predefined value.

3. The method according to claim 1, further comprising: filtering the first voltage magnitude, the second voltage magnitude, or both via a bandpass filter.

4. The method according to claim 1, further comprising: checking for a predefined second condition which represents a use of the electrical energy storage unit; and
ascertaining, in response to the predefined first condition and the predefined second condition being met, the value of a parameter of the mathematical model and changing the value of the parameter in the mathematical model.

5. The method according to claim 4, where the predefined second condition for the representation of the use is at least one selected from the group consisting of a state of charge value in the range from 30% to 80%, a temperature value over 20° C., and an age value of fewer than 180 days.

6. An apparatus (32) for operating an electrical energy storage unit, comprising an electronic control unit, the electronic control unit configured to
ascertain, via a current sensor, a current magnitude which represents an electrical current which flows into or out of the electrical energy storage unit
ascertain, via a voltage sensor, a first voltage magnitude which represents an electrical voltage which is present between two pole terminals of the electrical energy storage unit
ascertain a second voltage magnitude which represents an electrical voltage and is obtained from the mathematical model of the electrical energy storage unit, where the mathematical model is loaded with the current magnitude;
check for a predefined first condition which represents an accuracy of a mathematical model of the electrical energy storage unit, the predefined first condition including a quantitative deviation of the second voltage magnitude from the first voltage magnitude of less than 20 mV;
check for a predefined second condition which represents a use of the electrical energy storage unit, where the predefined second condition for the representation of the use is at least one selected from the group consisting of a state of charge value in the range from 30% to 80%, a temperature value over 20° C., and an age value of fewer than 180 days;
in response to the predefined first condition and the predefined second condition being satisfied, ascertain a value of a parameter of the mathematical model and change the value of the parameter in the mathematical model; and
operate the electrical energy storage unit with the changed mathematical model.

7. A non-transitory, machine-readable storage medium containing instructions that when executed by a computer cause the computer to
ascertain, via a current sensor, a current magnitude which represents an electrical current which flows into or out of the electrical energy storage unit
ascertain, via a voltage sensor, a first voltage magnitude which represents an electrical voltage which is present between two pole terminals of the electrical energy storage unit
ascertain a second voltage magnitude which represents an electrical voltage and is obtained from the mathematical model of the electrical energy storage unit, where the mathematical model is loaded with the current magnitude;
check for a predefined first condition which represents an accuracy of a mathematical model of the electrical energy storage unit, the predefined first condition including a quantitative deviation of the second voltage magnitude from the first voltage magnitude of less than 20 mV;
in response to the predefined first condition being satisfied, ascertain a value of a parameter of the mathematical model and change the value of the parameter in the mathematical model; and
operate the electrical energy storage unit with the changed mathematical model.

8. An electrical energy storage system (30), comprising at least one electrical energy storage unit and an apparatus (32) including an electronic control unit, the electronic control unit configured to
ascertain, via a current sensor, a current magnitude which represents an electrical current which flows into or out of the electrical energy storage unit
ascertain, via a voltage sensor, a first voltage magnitude which represents an electrical voltage which is present between two pole terminals of the electrical energy storage unit
ascertain a second voltage magnitude which represents an electrical voltage and is obtained from the mathematical model of the electrical energy storage unit, where the mathematical model is loaded with the current magnitude;

check for a predefined first condition which represents an accuracy of a mathematical model of the electrical energy storage unit, the predefined first condition including a quantitative deviation of the second voltage magnitude from the first voltage magnitude of less than 20 mV;

in response to the predefined first condition being satisfied, ascertain a value of a parameter of the mathematical model and change the value of the parameter in the mathematical model; and operate the electrical energy storage unit with the changed mathematical model.

9. The method of claim 1, wherein the predefined first condition includes the quantitative deviation of the second voltage magnitude from the first voltage magnitude not being exceeded for a predefined period of time.

* * * * *